(12) United States Patent
Zheng et al.

(10) Patent No.: US 11,049,665 B2
(45) Date of Patent: Jun. 29, 2021

(54) CAPACITOR EXPLOSION-PROOF DEVICE, CIRCUIT BOARD AND ELECTRONIC DEVICE

(71) Applicant: BEIJING XIAOMI MOBILE SOFTWARE CO., LTD., Beijing (CN)

(72) Inventors: Riwen Zheng, Beijing (CN); Kun Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 16/898,386

(22) Filed: Jun. 10, 2020

(65) Prior Publication Data
US 2021/0166887 A1    Jun. 3, 2021

(30) Foreign Application Priority Data
Dec. 2, 2019    (CN) .......................... 201911216524.3

(51) Int. Cl.
*H01G 9/12* (2006.01)
*H05K 1/18* (2006.01)

(52) U.S. Cl.
CPC .............. *H01G 9/12* (2013.01); *H05K 1/181* (2013.01); *H05K 2201/10015* (2013.01)

(58) Field of Classification Search
CPC ...................................................... H01G 9/12

USPC ........................................................ 361/752
See application file for complete search history.

(56) References Cited

U.S. PATENT DOCUMENTS

| 4,617,611 A * | 10/1986 | Miura | H01G 9/12 |
| | | | 361/521 |
| 2018/0226199 A1 | 8/2018 | Joo et al. | |
| 2019/0392993 A1* | 12/2019 | Sato | H01G 9/14 |

FOREIGN PATENT DOCUMENTS

| EP | 2439758 A1 | 4/2012 |
| JP | H08138965 A | 5/1996 |
| WO | 8401468 A1 | 4/1984 |

OTHER PUBLICATIONS

Extended European Search Report (EESR) in EP Application No. P20192004.8, dated Feb. 12, 2021.

* cited by examiner

*Primary Examiner* — Stanley Tso
(74) *Attorney, Agent, or Firm* — Syncoda LLC; Feng Ma

(57) ABSTRACT

A capacitor explosion-proof device includes an explosion-proof casing, covering a top of an electrolytic capacitor opposing the pins. The explosion-proof casing includes a side plate, at least one vent disposed on the side plate and opposing the top. By avoiding spread of electrolyte solution, probability of a fire can be reduced.

8 Claims, 2 Drawing Sheets

CAPACITOR EXPLOSION-PROOF DEVICE, CIRCUIT BOARD AND ELECTRONIC DEVICE

CROSS-REFERENCE TO RELATED APPLICATION

This application claims priority to Chinese Patent Application No. 201911216524.3 filed on Dec. 2, 2019, the disclosure of which is hereby incorporated by reference in its entirety.

BACKGROUND

The rapid development of electronic device technologies has brought great convenience to users' work and life, and has seen progress in computers, communications, industrial processing, aviation, and other fields. However, electronic devices may also pose safety risks to the users. For example, electronic device can cause fires resulting in injuries and damages.

SUMMARY

Various embodiments of the present disclosure provide a capacitor explosion-proof device, a circuit board with an explosion-proof device, and an electronic device.

According to a first aspect of embodiments of the present disclosure, a capacitor explosion-proof device is provided. The capacitor explosion-proof device includes an explosion-proof casing, covering a top of an electrolytic capacitor opposing a plurality of pins. The explosion-proof casing includes a side plate, at least one vent being provided on the side plate, and being provided opposing the top.

In some embodiments, the vent is a cross-shaped hole provided in a center of the side plate.

According to a second aspect of the embodiments of the present disclosure, there is provided a circuit board having the capacitor explosion-proof device according to the above aspect or any one of the above embodiments, the circuit board includes: fixing holes; and an electrolytic capacitor, wherein the capacitor explosion-proof device is fixed on a panel of the circuit board through the fixing hole; the electrolytic capacitor is accommodated in a space formed by the capacitor explosion-proof device and the panel of the circuit board.

According to a third aspect of embodiments of the present disclosure, an electronic device is provided, including the circuit board as described in the above aspect or any one of the above embodiments.

It is to be understood that both the foregoing general description and the following detailed description are exemplary and explanatory only and shall not be construed to limit the present disclosure.

BRIEF DESCRIPTION OF THE DRAWINGS

The accompanying drawings, which are incorporated in the specification and constitute a part of the disclosure, show exemplary embodiments of the present disclosure. The drawings along with the specification can explain principles of some embodiments of the present disclosure.

DETAILED DESCRIPTION

Figure 1:
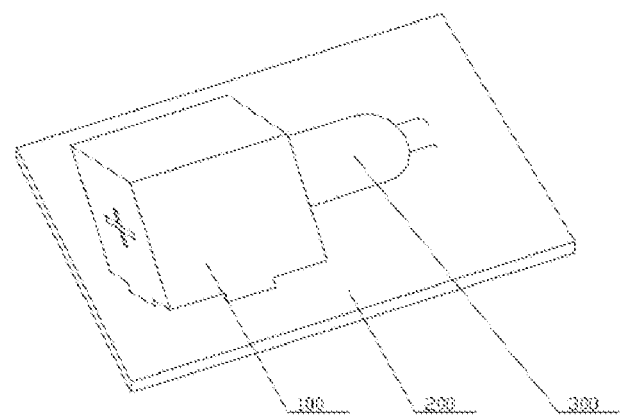
FIG. 1 is a perspective view showing a capacitor-switch valve according to some embodiments of the present disclosure.

Some embodiments will be described in detail herein, examples of which are illustrated in the accompanying drawings. When referring to the drawings below, the same numerals in different drawings represent the same or similar elements, unless otherwise indicated. The implementations described in the following exemplary embodiments do not represent all implementations consistent with the present disclosure. Instead, they are merely examples of devices and methods consistent with aspects of the present disclosure as detailed in the appended claims.

Many electronic device fires are caused by a valve opening of electrolytic capacitor. The opening of the valve of the electrolytic capacitor may be caused by overvoltage of the electrolytic capacitor resulting from, for example, grid fluctuations. The whole electronic device may catch fire from the fire of the electrolyte solution after the valve is opened. In some cases, the electronic device fire can be caused by the fire of the electrolyte solution after the valve is opened due to defective electrolytic capacitor in a production process.

Figure 2:
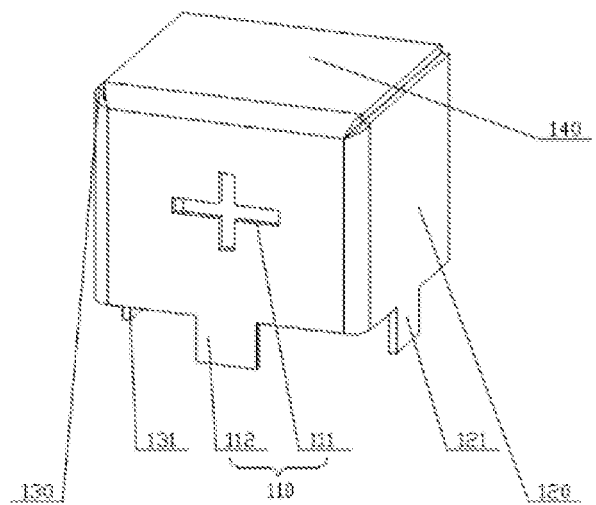
FIG. 2 is a perspective view showing an explosion-proof casing according to some embodiments of the present disclosure.
Figure 3:
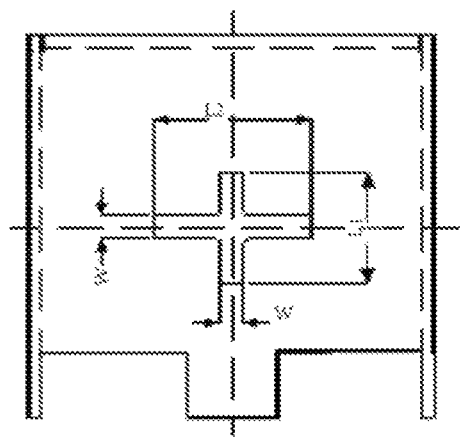
FIG. 3 is a schematic diagram showing a cross-shaped hole of an explosion-proof casing according to some embodiments of the present disclosure.

FIG. 1 is a perspective view showing a capacitor-switch valve according to some embodiments of the present disclosure. FIG. 2 is a perspective view showing an explosion-proof casing according to some embodiments of the present disclosure. FIG. 3 is a schematic diagram showing a cross-shaped hole of an explosion-proof casing according to some embodiments of the present disclosure.

According to an aspect of embodiments of the present disclosure, a capacitor explosion-proof device is provided. Referring to FIGS. 1 and 2, the capacitor explosion-proof device includes an explosion-proof casing 100, covering a top of an electrolytic capacitor 300 opposing a plurality of pins of the capacitor. The explosion-proof casing 100 includes side plates. At least one vent 111 is provided on the side plate. The vent 111 is provided opposing the top.

The electrolytic capacitor 300 is covered in the explosion-proof casing 100 through the explosion-proof casing 100. After the electrolytic capacitor 300 catches fire, the electrolyte and the electrolyte solution are ejected from the top of the electrolytic capacitor 300, the vaporized electrolyte solution is ejected through the vent 111, and the not-vaporized electrolyte solution and the electrolyte are blocked by the explosion-proof casing 100 and remain inside the explosion-proof casing 100, thereby avoiding spreading of the electrolyte solution that is catching fire, preventing spreading of electrolyte on fire to a large area, and effectively reducing the probability of fire.

The material of the explosion-proof casing 100 may be various metals, flame-resistant material, or other materials, which is not limited herein. Those skilled in the art should understand that the application of various flame-resistant materials in the technical solutions involved in the present disclosure should fall within the scope of the protection of the present disclosure.

In some embodiments, the vent 111 is a cross-shaped hole provided in the center of the side plates.

When a valve of the electrolytic capacitor is opened, a large amount of gas and liquid will be generated. The vent 111 is set as the cross-shaped hole. Because the slit is small, a small amount of vaporized electrolyte solution will be ejected to the outside through the slit of the cross-shaped hole, thereby reducing the pressure of the gas inside the explosion-proof casing, preventing the electrolyte solution from accumulating, preventing the electrolyte solution from flowing to cause a larger hidden danger, and preventing the back spraying of the electrolyte or the electrolyte solution. A ratio of width and length of the slit of the cross-shaped hole is 1:4~8. In this embodiment, referring to FIG. 3, a ratio of the width of the slit, the length of the first slit and the length of the second slit can be set as W:L1:L2=1:5:7.

In some embodiments, the vent 111 is a round hole.

The vent 111 may also be provided as a round hole, effectively blocking the not-vaporized electrolyte solution and electrolyte.

In some embodiments, a plurality of round holes is evenly distributed on the side plates.

The plurality of round holes is provided on the side plates, which can reduce an area of a single hole, effectively blocking the not-vaporized electrolyte solution and electrolyte. At the same time, providing the plurality of round holes increases an area for exhausting the vaporized electrolyte solution, and reducing the impact of airflow on the capacitor.

It should be understood that the vent may also be provided as other shapes, such as triangular, diamond or square, or the like. As long as the vaporized electrolyte solution can be discharged out of the explosion-proof casing, through holes of any regular or irregular shape can be used. Those skilled in the art should understand that the application of through holes of various shapes in the technical solutions involved in the present disclosure should fall within the protection scope of the present disclosure.

In some embodiments, the side plate includes a first plate 110, and opposing ends of the first plate 110 are provided with a second plate 120 and a third plate 130. The explosion-proof casing 100 further includes a top plate 140. A bent plate structure is formed by the first plate 110 together with the top plate 140, the second plate 120 and the third plate 130. A first opening is formed on a side of the side plate opposing the first plate 110. A second opening is formed on a side of the side plate opposing the top plate 140.

The side plate is made into a U-shape, the first opening is used to cover the capacitor 300, and the second opening is used to cover on the circuit board 200.

In some embodiments, the vent 111 is provided in the first plate 110; the extension plate 112 is provided at the end of the second opening of the first plate 110.

The vent 111 is provided in the first plate 110, opposing the top of the capacitor 300, which is beneficial to the emission of the vaporized electrolyte solution. The extension plate 112 is provided in the second opening, which facilitates the permanent connection to the circuit board 200.

In some embodiments, a second extension plate 121 is provided at the end of the second opening of the second plate 120, and a third extension plate 131 is provided at the end of the second opening of the third plate 130.

The extension plates are provided at ends of the second opening of the second plate 120 and the third plate 130, which is fixed on the circuit board 200 together with the extension plate 112 at the end of the first plate 110, thereby increasing the strength of the explosion-proof casing 100, and effectively resisting the impact of the vaporized electrolyte solution.

According to another aspect of the embodiments of the present disclosure, there is provided a circuit board having the capacitor explosion-proof device according to the above aspect or any one of the above embodiments. The circuit board 200 includes a fixing hole and an electrolytic capacitor 300. The capacitor explosion-proof device is fixed on the circuit board 200 panel through the fixing hole. The electrolytic capacitor 300 is accommodated in the space formed by the capacitor explosion-proof device and the circuit board 200 panel.

In some embodiments, an extension plate 112 is provided at an end of the side plate, the circuit board is provided with a fixing hole, and the extension plate 112 is connected to the fixing hole.

The explosion-proof casing is fixed on the circuit board 200 through the fitting of the extension plate 112 and the fixing hole. The extension plate 112 may be made as a bent plate, and a screw hole matching the fixing hole of the circuit board 200 is processed on the flat plate at the bottom of the extension plate 112 and fixed by bolts or the like. An unthreaded hole may be processed on the flat plate, and the fixing is performed through fixing supports or other components.

In some embodiments, metal sheets are fixed around the fixing hole.

As another embodiment, metal sheets are attached to the periphery of the fixing hole, and the extension plate 112 and the metal sheets are soldered and connected by welding. When the circuit board 200 is manufactured, it can be soldered together with other electronic components, which is convenient to operate and improves the efficiency of manufacturing the circuit board.

According to another aspect of embodiments of the present disclosure, there is provided an electronic device provided with a power supply, including a capacitor-switch valve, the capacitor-switch valve being the capacitor-switch valve described in the above aspect. The capacitor-switch valve is electrically connected to the power supply.

The capacitor-switch valve installed with the explosion-proof casing is applied to the electronic device. The capacitor 300 is covered in the explosion-proof casing through the explosion-proof casing 100. After the capacitor 300 catches fire, the electrolyte and the electrolyte solution are ejected from the top of the capacitor 300, the vaporized electrolyte solution is ejected through the vent, and the not-vaporized electrolyte solution and the electrolyte are blocked by the explosion-proof casing 100 and remain inside the explosion-proof casing 100, thereby avoiding spreading of the electrolyte solution to cause fire, preventing spreading of electrolyte on fire to a large area, and effectively reducing the probability of fire.

In some embodiments, the vent is a round hole.

In some embodiments, a plurality of round holes is evenly distributed on the side plate.

In some embodiments, the side plate includes a first plate, and opposing two ends of the first plate are provided with a second plate and a third plate; the explosion-proof casing further includes a top plate, the first plate forms a bent plate structure with the top plate, the second plate and the third plate; a first opening is formed on a side of the side plate opposing the first plate; and a second opening is formed on a side of the side plate opposing the top plate.

In some embodiments, the vent is provided in the first plate; an extension plate is provided at an end of the second opening of the first plate.

In some embodiments, a second extension plate is provided at an end of the second opening of the second plate, and a third extension plate is provided at an end of the second opening of the third plate.

In some embodiments, extension plates are provided at ends of the side plate, and the extension plates are provided at the ends of the side plate of the capacitor explosion-proof device. A fixing hole is provided on the circuit board, and the extension plates are connected to the fixing hole of the circuit board.

In some embodiments, metal sheets are fixed on a periphery of the fixing hole.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

The above description includes part of embodiments of the present disclosure, and not limits the present disclosure. Any modifications, equivalent substitutions, improvements, etc., within the spirit and principles of the present disclosure, are included in the scope of protection of the present disclosure.

It is apparent that those of ordinary skill in the art can make various modifications and variations to the embodiments of the disclosure without departing from the spirit and scope of the disclosure. Thus, it is intended that the present disclosure cover the modifications and the modifications.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or device.

In the case of no more limitation, the element defined by the sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of module, devices or components, etc. are employed, the circuit(s), unit(s), device(s), component(s), etc. can be singular, or plural.

Based on various embodiments of the present disclosure, the disclosed apparatuses, devices, and methods can be implemented in other manners. For example, the abovementioned devices can employ various methods of use or implementation as disclosed herein.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

Dividing the device into different "regions," "module," "components" or "layers," etc. merely reflect various logical functions according to some embodiments, and actual implementations can have other divisions of "regions," "module," "components" or "layers," etc. realizing similar functions as described above, or without divisions. For example, multiple regions, module, or layers, etc. can be combined or can be integrated into another system. In addition, some features can be omitted, and some steps in the methods can be skipped.

Those of ordinary skill in the art will appreciate that the module, components, regions, or layers, etc. in the devices provided by various embodiments described above can be provided in the one or more devices described above. They can also be located in one or multiple devices that is (are) different from the example embodiments described above or illustrated in the accompanying drawings. For example, the module, regions, or layers, etc. in various embodiments described above can be integrated into one module or divided into several sub-modules.

The various device components, modules, module, blocks, or portions may have modular configurations, or are composed of discrete components, but nonetheless can be referred to as "modules" in general. In other words, the "components," "modules," "blocks," "portions," or "module" referred to herein may or may not be in modular forms, and these phrases may be interchangeably used.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

The invention claimed is:

1. An electronic, comprising a circuit board including a capacitor explosion-proof device, wherein:
   the capacitor explosion-proof device comprises an explosion-proof casing, covering a top of an electrolytic capacitor opposing a plurality of pins of the electrolytic capacitor, and comprising a side plate;
   at least one vent is provided on the side plate, and is provided opposing the top of the electrolytic capacitor;
   the circuit board further comprises:
   a fixing hole; and
   the electrolytic capacitor having the plurality of pins,
   the capacitor explosion-proof device is fixed on a panel of the circuit board through the fixing hole; and
   the electrolytic capacitor is accommodated in a space formed by the capacitor explosion-proof device and the panel of the circuit board;
   the explosion-proof casing is configured to, upon the electrolytic capacitor catching fire or having an overload pressure, eject vaporized electrolyte solution from the top of the electrolytic capacitor through the vent, and block the not-vaporized electrolyte solution and the electrolyte to remain inside the explosion-proof casing, thereby avoiding spreading of the electrolyte solution that is catching fire,
   preventing spreading of electrolyte on fire to a large area, and effectively reducing fire probability of the electronic device;
   the vent is a cross-shaped hole provided in a center of the side plate;
   upon a valve of the electrolytic capacitor is opened, the cross-shaped hole is configured to release a portion of vaporized electrolyte solution through slits of the cross-shaped hole,
   thereby reducing pressure inside the explosion-proof casing,
   preventing the electrolyte solution from accumulating and back spraying; and
   a ratio of width and length of the slits of the cross-shaped hole is 1:4~8.

2. The electronic device according to claim 1, wherein a ratio of width of the slits, a length of a first slit and a length of a second slit are configured as W:L1:L2=1:5:7.

3. The electronic device according to claim 2, wherein:
   the side plate is among a plurality of plates including a first plate, and opposing ends of the first plate are provided with a second plate and a third plate; and
   the explosion-proof casing further includes a top plate.

4. The electronic device according to claim 3, wherein:
   a bent plate structure is formed by the first plate together with the top plate, the second plate and the third plate;
   a first opening is formed on a side of the side plate opposing the first plate; and
   a second opening is formed on a side of the side plate opposing the top plate.

5. The electronic device according to claim 4, wherein:
   the first side plate is made into a U-shape;
   the first opening is configured to cover the electrolytic capacitor; and
   the second opening is configured over the circuit board.

6. The electronic device according to claim 5, wherein:
   the vent is provided in the first plate opposing the top of the electrolytic capacitor, to facilitate release of the vaporized electrolyte solution; and
   the extension plate is provided at an end of the second opening of the first plate, to facilitate permanent connection to the circuit board.

7. The electronic device according to claim 6, wherein:
   a second extension plate is provided at an end of the second opening of the second plate; and
   a third extension plate is provided at an end of the second opening of the third side plate.

8. The electronic device according to claim 7, wherein:
   the second and third extension plates are provided at ends of the second openings of the second plate and the third plate, and are fixed on the circuit board together with the first extension plate at the end of the first side plate, thereby increasing strength of the explosion-proof casing and resisting impact of the vaporized electrolyte solution.

* * * * *